(12) United States Patent
Randolph

(10) Patent No.: US 9,022,599 B2
(45) Date of Patent: May 5, 2015

(54) MULTI-POINT TO SINGLE POINT OPTIC

(71) Applicant: Cree, Inc., Durham, NC (US)

(72) Inventor: David N. Randolph, Rougemont, NC (US)

(73) Assignee: Cree, Inc., Durham, NC (US)

( * ) Notice: Subject to any disclaimer, the term of this patent is extended or adjusted under 35 U.S.C. 154(b) by 126 days.

(21) Appl. No.: 13/837,200

(22) Filed: Mar. 15, 2013

(65) Prior Publication Data
US 2014/0268732 A1  Sep. 18, 2014

(51) Int. Cl.
| F21V 9/00 | (2006.01) |
| F21V 5/04 | (2006.01) |
| F21V 7/08 | (2006.01) |
| F21V 7/09 | (2006.01) |
| G02B 19/00 | (2006.01) |
| F21Y 101/02 | (2006.01) |
| F21Y 113/00 | (2006.01) |

(52) U.S. Cl.
CPC ...... *F21V 5/04* (2013.01); *F21V 7/08* (2013.01); *F21V 7/09* (2013.01); *F21Y 2101/02* (2013.01); *F21Y 2113/005* (2013.01); *G02B 19/0066* (2013.01); *G02B 19/0028* (2013.01)

(58) Field of Classification Search
CPC ............ G02B 6/0001; G02B 19/0028; G02B 19/0066; F21V 5/04; F21V 7/08; F21V 7/09; F21Y 2113/005; F21Y 2101/02
USPC ............... 362/231, 217.06, 249.14, 326, 328, 362/800, 235, 236, 237, 234, 317; 313/110, 313/111; 257/98
See application file for complete search history.

(56) References Cited

U.S. PATENT DOCUMENTS

| D341,000 | S | 11/1993 | Kramer |
| 6,414,801 | B1 | 7/2002 | Roller |
| D636,929 | S | 4/2011 | Kong et al. |
| D643,966 | S | 8/2011 | Postelmans |
| D679,033 | S | 3/2013 | Dungan et al. |
| D696,436 | S | 12/2013 | Pickard et al. |
| 2006/0061989 | A1* | 3/2006 | Holder et al. ............ 362/231 |
| 2007/0159093 | A1* | 7/2007 | Yuki et al. ............... 313/512 |
| 2008/0174996 | A1* | 7/2008 | Lu et al. .................. 362/235 |

(Continued)

FOREIGN PATENT DOCUMENTS

GB          356244 A  *  9/1931  ............... F21V 7/08

OTHER PUBLICATIONS

Restriction Requirement for U.S. Appl. No. 29/449,882, mailed Mar. 26, 2014, 4 pages.

(Continued)

*Primary Examiner* — Andrew Coughlin
*Assistant Examiner* — Glenn Zimmerman
(74) *Attorney, Agent, or Firm* — Withrow & Terranova, P.L.L.C.

(57) ABSTRACT

A lighting component having an optic is provided. The optic includes a body formed from a plurality of partial elliptical bodies. Each partial elliptical body is substantially elliptical about a source focal point and a common focal point. Each source focal point for the partial elliptical bodies is disparately located and each common focal point for the plurality of partial elliptical bodies is collocated. The body of the optic has a common outlet proximate the common focal point and a plurality of source inlets where each source inlet of the plurality of source inlets is proximate the source focal point for a corresponding one of the plurality of partial elliptical tubes.

29 Claims, 14 Drawing Sheets

(56) References Cited

U.S. PATENT DOCUMENTS

2009/0310345 A1* 12/2009 Holder et al. ................ 362/231
2011/0182065 A1    7/2011 Negley et al.

OTHER PUBLICATIONS

Notice of Allowance for U.S. Appl. No. 29/449,882, mailed Aug. 1, 2014, 7 pages.

* cited by examiner

MULTI-POINT TO SINGLE POINT OPTIC

FIELD OF THE DISCLOSURE

The present disclosure relates to an optic for a lighting fixture and more specifically to a multi-point to single point optic.

BACKGROUND

In recent years, a movement has gained traction to replace incandescent and fluorescent light bulbs with solid-state lighting devices that employ more efficient lighting technologies. One such technology that shows tremendous promise employs light emitting diodes (LEDs). Compared with incandescent light bulbs, LED-based light devices are more efficient and longer lasting. With reference to fluorescent bulbs, LED-based light devices are longer lasting. As a result of these advantages over incandescent and fluorescent lighting fixtures, lighting fixtures that employ LED-based light devices are expected to replace fluorescent bulbs in residential, commercial, and industrial applications.

SUMMARY

The present disclosure relates to an optic for a lighting fixture. The optic has a solid body that is formed from a number of partial elliptical bodies. Each of the partial elliptical bodies is substantially elliptical about a source focal point and a common focal point wherein each source focal point for the partial elliptical bodies is disparately located, and each common focal point for the partial elliptical bodies is collocated. The body has a common outlet proximate the common focal point and a number of source inlets wherein each source inlet is proximate the source focal point for a corresponding one of the partial elliptical tubes. The source inlets and common outlet may, but need not, correspond to recesses extending into the partial elliptical bodies. The recesses may be concave and substantially hemispherical.

The interior of the body provides a solid interior. When light sources are provided in the source inlet at each source focal point of the different elliptical bodies, light emitted from each light source is substantially mixed at the common focal point. The different light sources may emit different colors of light wherein the mixed light at the common focal point has desired color, color temperature, or other desired characteristics. For example, the light sources may be solid-state light sources, such as LEDs, wherein LEDs of a first color, such as red, are provided at a first set of the source focal points, and LEDs of a different color, such as blue-shifted yellow or blue-shifted green, are provided at a different set of the source focal points. The resulting mixed light at the common focal point may be white light at a desired color temperature.

In one embodiment, the LEDs are mounted at the source focal points such that a central axis of the light emitted from the LEDs coincides with a body axis of the corresponding partial elliptical bodies. The body axis extends through both the common focal point and the source focal point for the corresponding partial elliptical body. Light may primarily exit the optic via the common outlet. The common outlet may be covered by a lens assembly that may include a lens, a diffuser, or a combination thereof. Further, an external reflector may be mounted about the common outlet to help direct the light exiting the common outlet. The interior of the optic may be substantially clear, and the body may be formed of acrylic, glass, a polymer, polycarbonate, and the like.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 9:
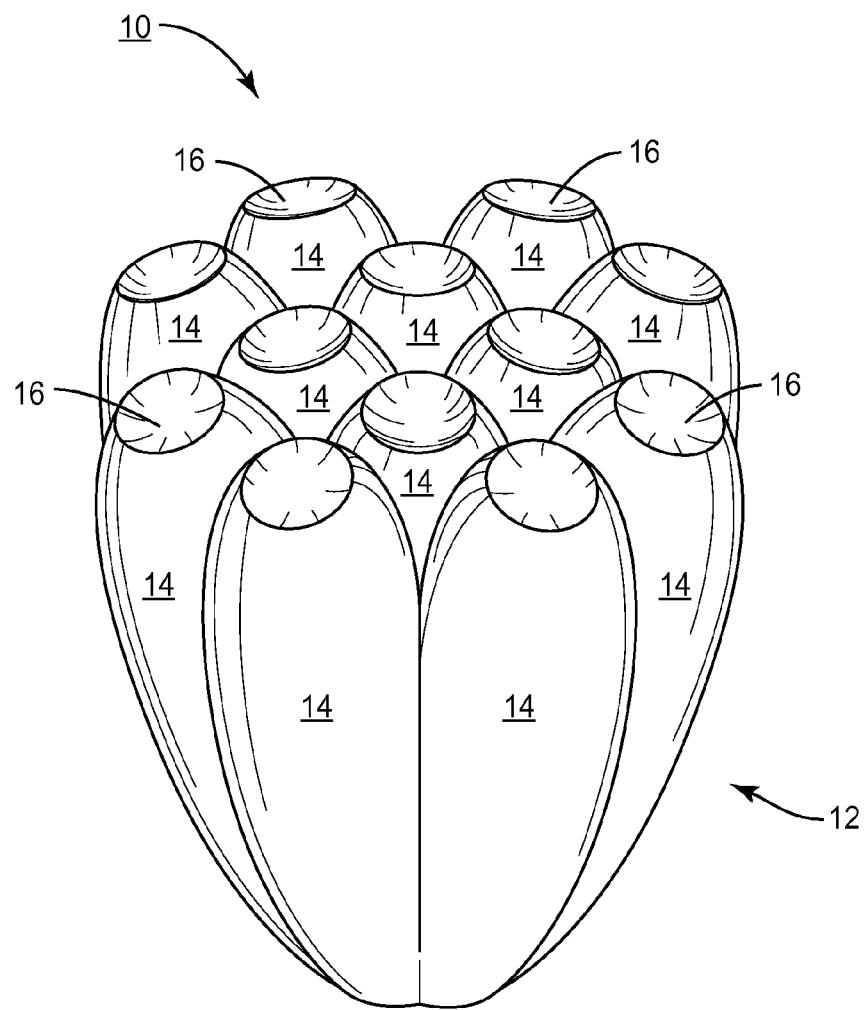

FIG. 9 shoes a top isometric view of an optic having twelve partial elliptical tubes in accordance with an embodiment of the present disclosure.

Figure 10:
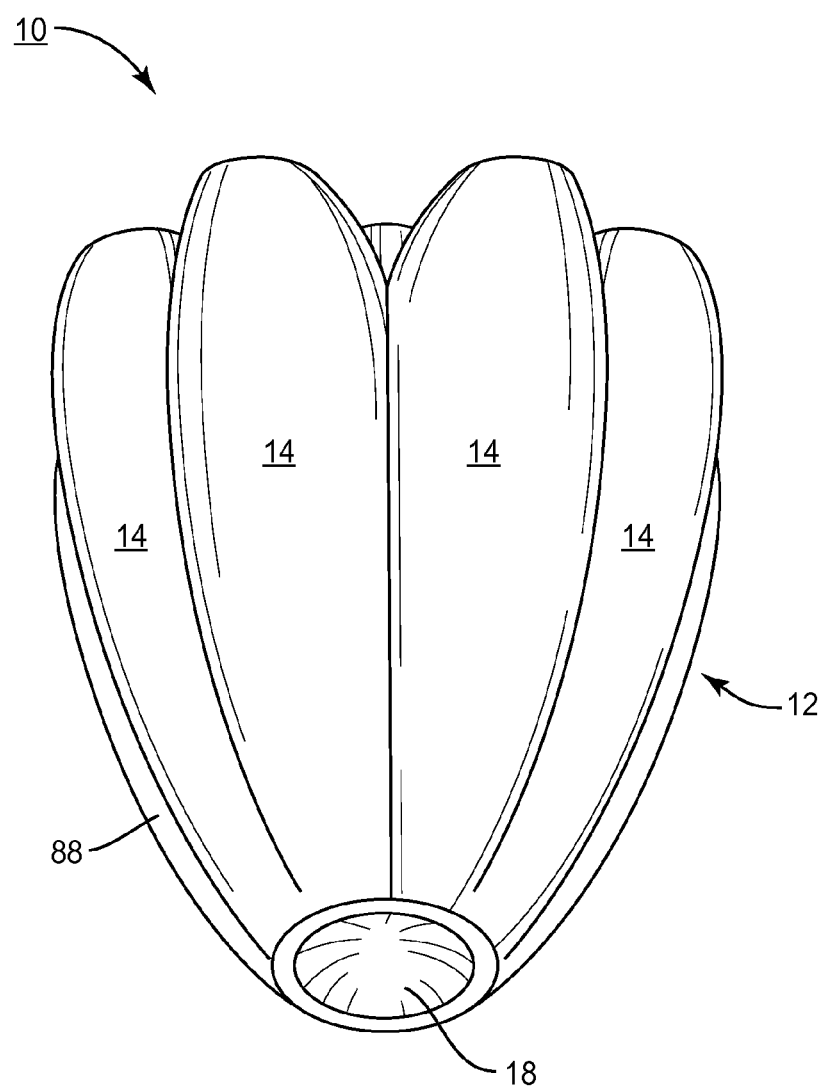

FIG. 10 is a bottom isometric view of the optic shown in FIG. 8.

Figure 11:
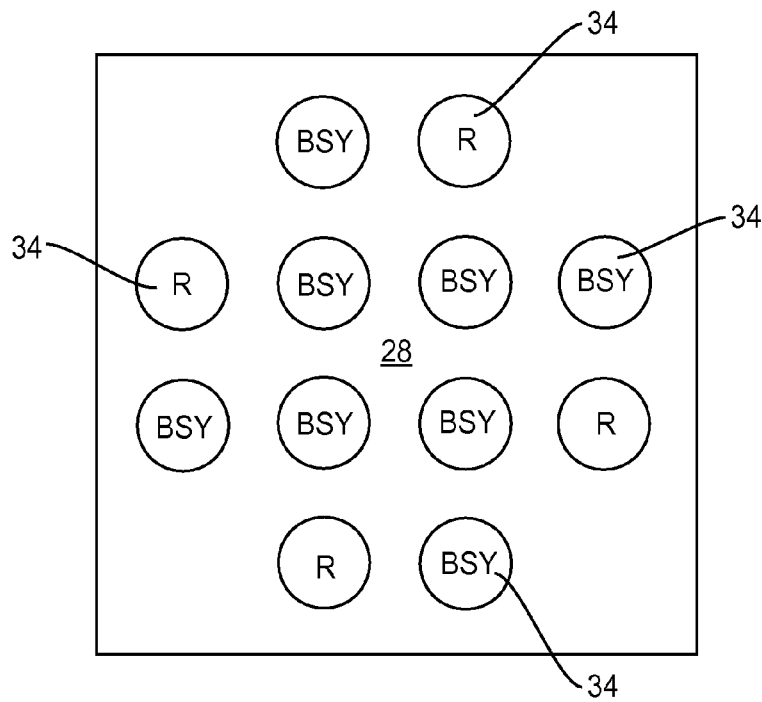

FIG. 11 shows a printed circuit board upon which LEDs are mounted in accordance with an embodiment of the present disclosure.

Figure 12:
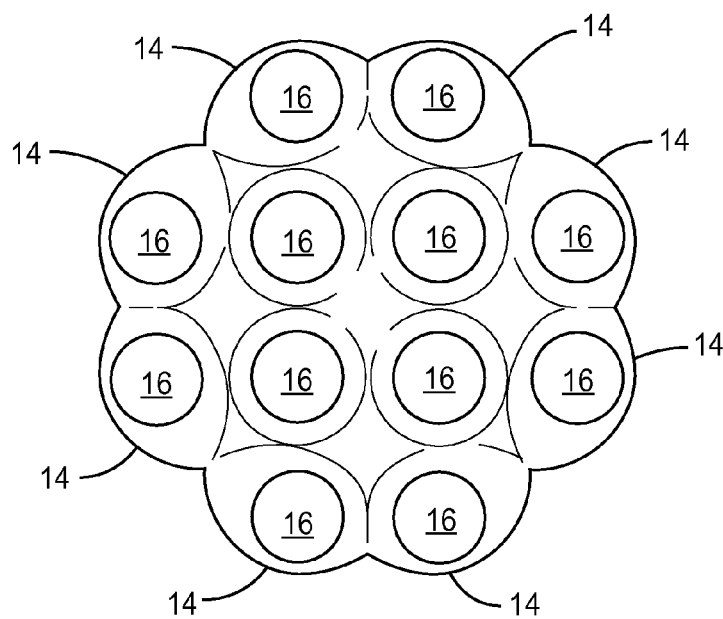

FIG. 12 shows a top view of the optic shown in FIG. 11.

Figure 13:
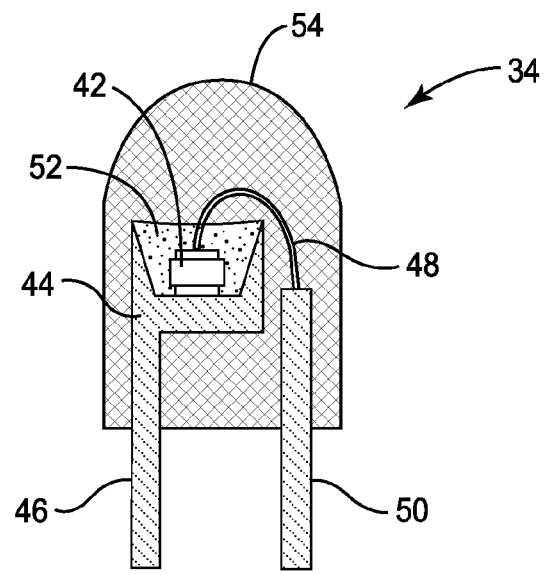

FIG. 13 shows a first LED embodiment in accordance with an embodiment of the present disclosure.

Figure 14:
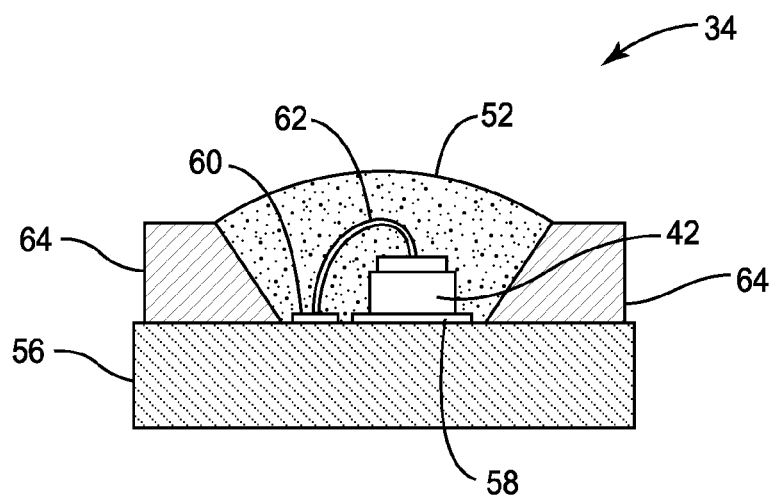

FIG. 14 shows a second LED embodiment in accordance with an embodiment of the present disclosure.

Figure 15:
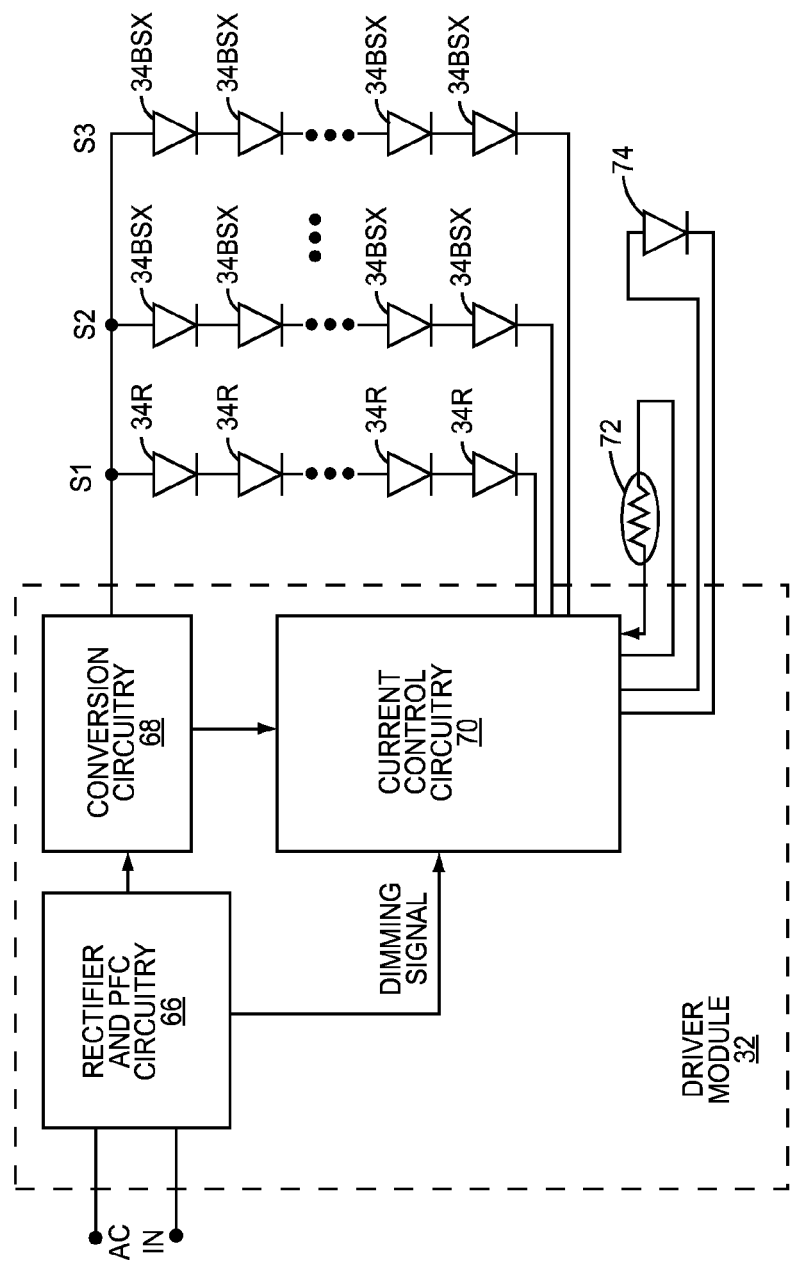

FIG. 15 is a schematic of the driver module electronics that drive the LEDs in accordance with an embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
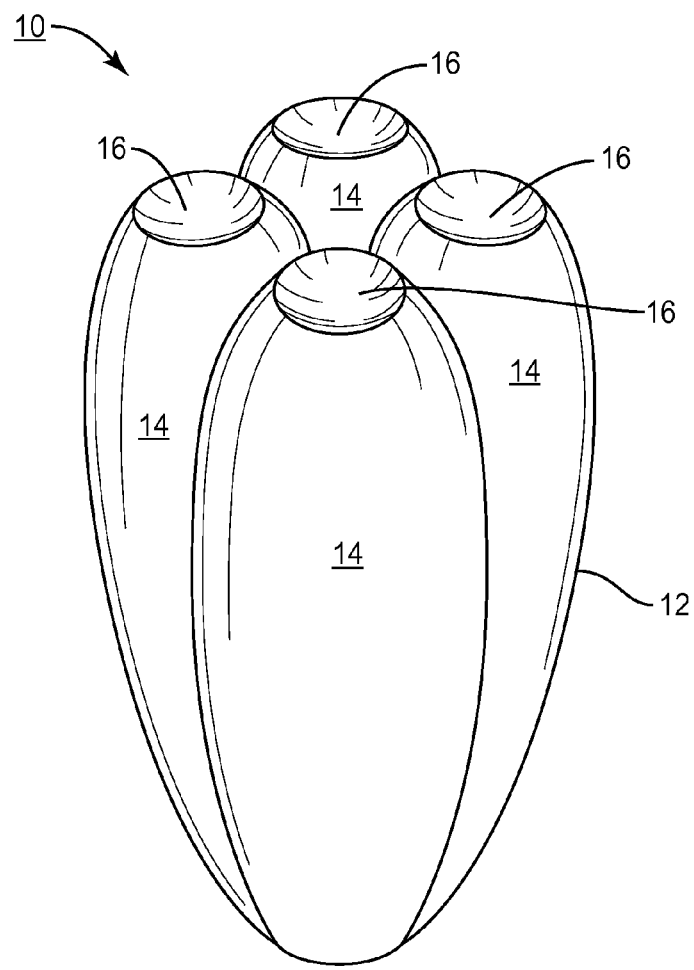
FIG. 1 is a top isometric view of an optic with four partial elliptical tubes in accordance with an embodiment of the present disclosure.
Figure 2:
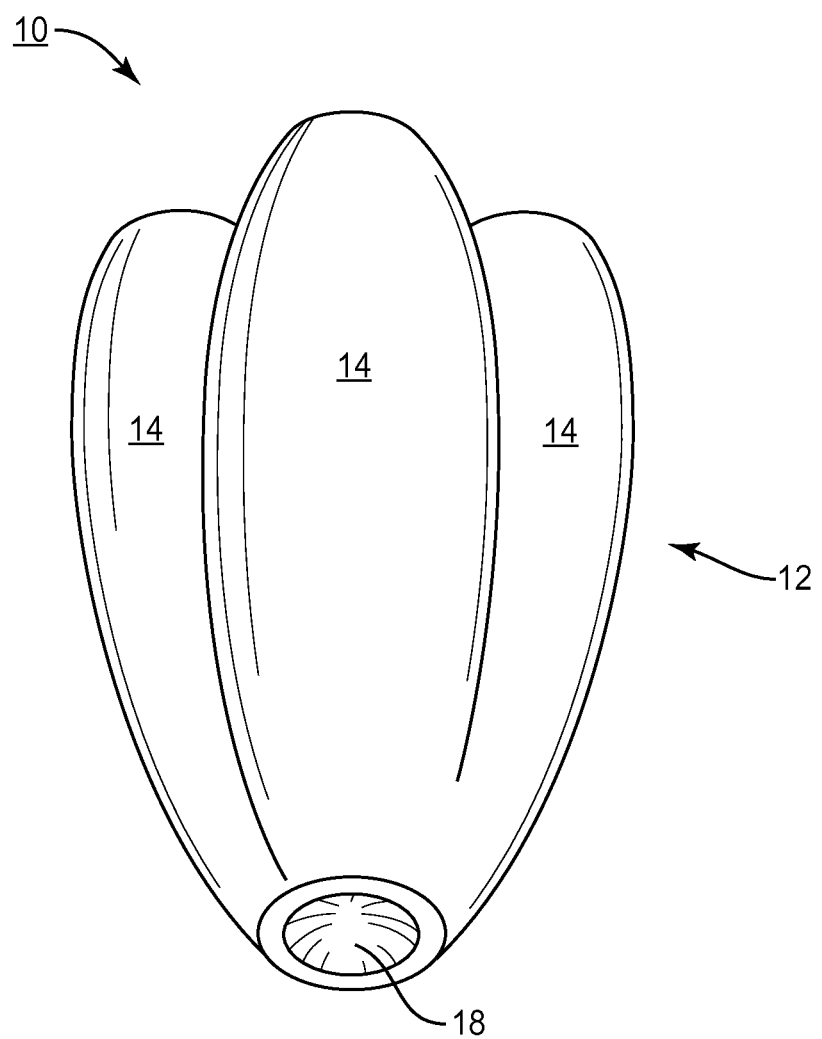
FIG. 2 is a bottom isometric view of the optic shown in FIG. 1.

With reference to FIGS. 1 and 2, an exemplary optic 10 for a lighting fixture is illustrated in accordance with an embodiment of the present disclosure. The optic 10 includes a body 12 formed by a number of partial elliptical bodies 14. FIGS. 1 and 2 illustrate an embodiment with four partial elliptical bodies 14, although the optic 10 may include any number of partial elliptical bodies, examples of which are provided further below. The body 12 may be formed of acrylic, glass, a polymer, polycarbonate, or the like. In one embodiment, the body 12 is completely solid and formed from a substantially clear material. The optic 10 has source inlets 16 at the top end of the partial elliptical bodies 14, as shown in FIG. 1, and a common outlet 18 at the bottom ends of the partial elliptical bodies 14, as show in FIG. 2. Notably, the bottom ends of the partial elliptical bodies 14 effectively converge with one another, such that there is only one common outlet 18. The source inlets 16 and common outlets 18 may, but need not, correspond to recesses extending into the partial elliptical bodies. The recesses may be concave and generally hemispherical, but need not be a perfect half-sphere or have a uniform radius.

Figure 3:
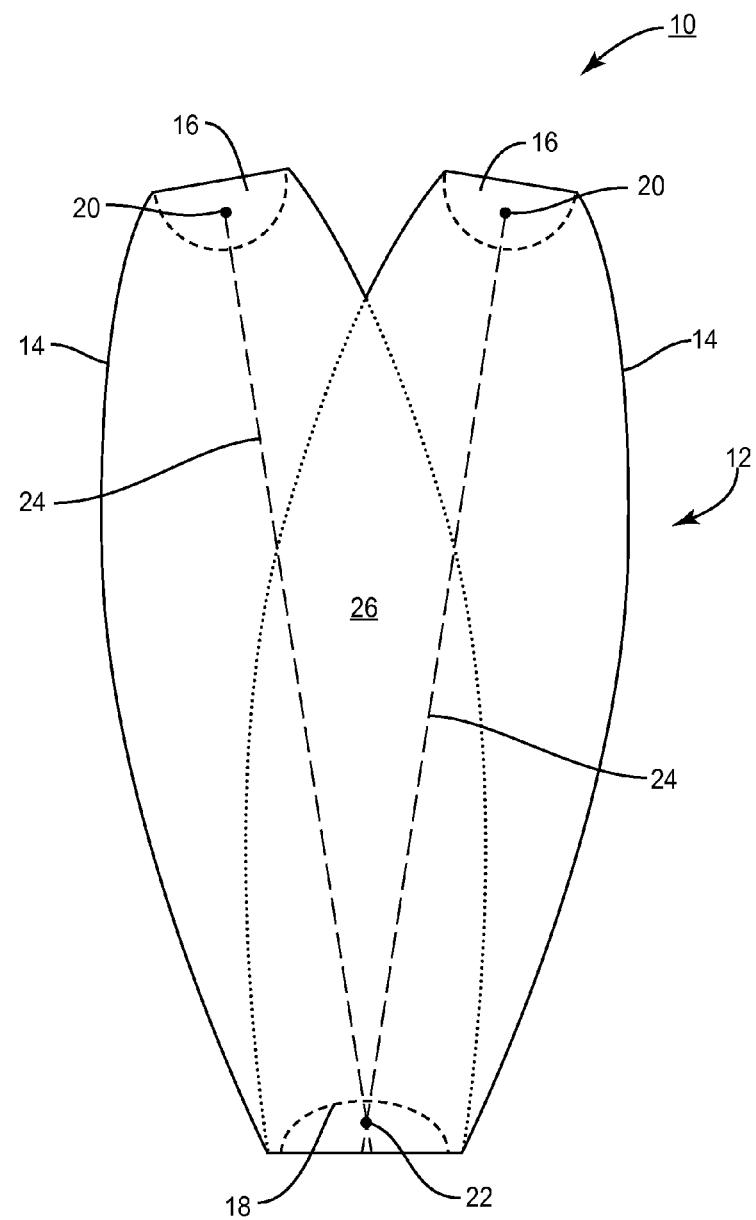
FIG. 3 is a cross-sectional of the optic shown in FIG. 1.

FIG. 3 is cross-sectional view of the optic 10 illustrated in FIGS. 1 and 2. As illustrated, each of the partial elliptical bodies 14 is substantially elliptical about a source focal point 20 and a common focal point 22, wherein each source focal point 20 for each partial elliptical body 14 is disparately located, and each common focal point 20 for the partial elliptical bodies 14 is collocated. The common outlet 18 is proximate the corresponding common focal point 22, and each of the source inlets 16 is proximate the source focal point 20 for a corresponding one of the partial elliptical tubes 14. A body axis 24 for each of the partial elliptical tubes 14 runs through the common focal point 22 and the corresponding source focal point 20. An interior 26 of the body 12 provides a mixing region.

Figure 4:
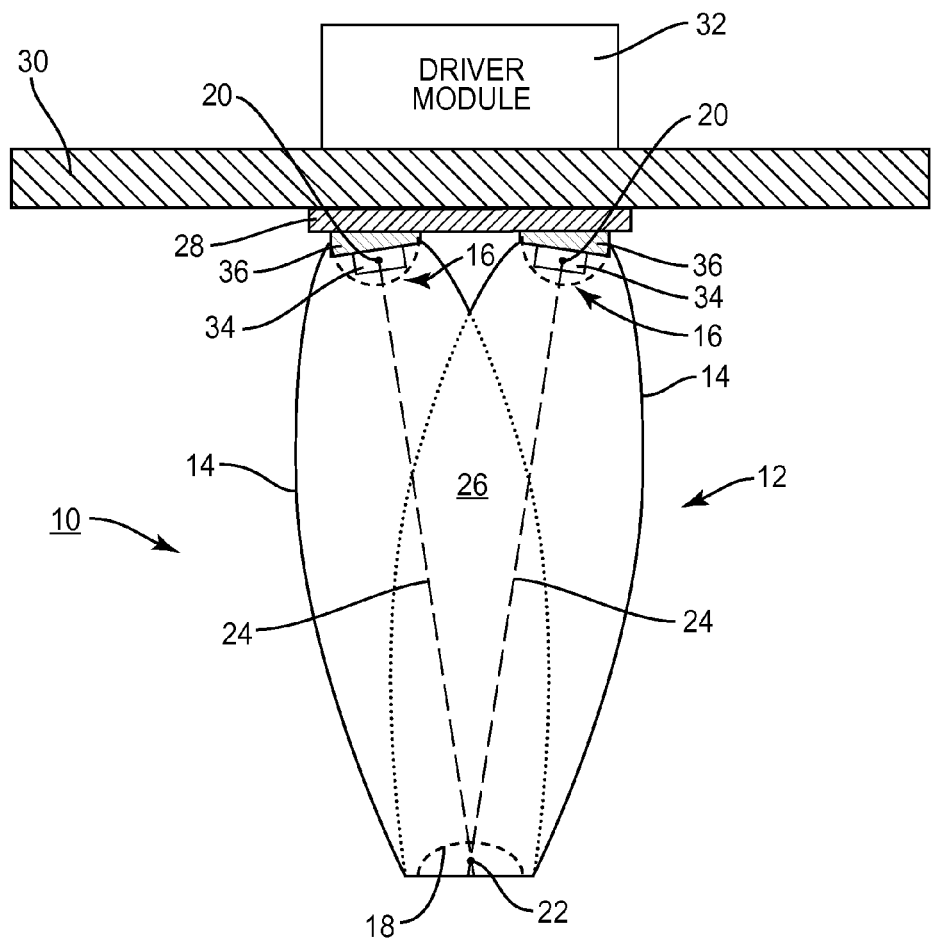
FIG. 4 is a cross-sectional of the optic shown in FIG. 1 wherein the optic is coupled to a printed circuit board, which is coupled to a mounting structure.

With reference to FIG. 4, the optic 10 is shown mounted to a printed circuit board 28, which is attached to a mounting structure 30. The printed circuit board 28 is attached to a bottom surface of the mounting structure 30, and a driver module 32 is mounted on a top surface of the mounting structure 30. The printed circuit board 28 has solid-state lighting sources, such as LEDs 34, attached to the side of the printed circuit board 28 that faces the top of the optic 10. In this embodiment, one LED 34 is positioned inside a source inlet 16 and at the source focal point 20 for each of the partial elliptical tubes 14. In other embodiments, a cluster of LEDs may be placed at the source focal point 20 for each of the partial elliptical tubes 14.

In one embodiment, a wedge-shaped mounting block 36 is used to not only locate each LED 34 at the corresponding source focal point 20, but to also angle the LED 34, if necessary. In one embodiment, the mounting blocks 36 are shaped and sized such that the LEDs 34 are mounted at the source focal points 20 and a central axis of the light emitted from the LEDs 34 (or cluster thereof) coincides with the body axis 24 of the corresponding partial elliptical bodies 14. As noted, the body axis 24 extends through both the common focal point 22 and the source focal point 20 for the corresponding partial elliptical body 14.

Alternatively, the LEDs 34 may be mounted flush on the surface of the printed circuit board 28. In this instance, the central beam of the LEDs 34 will not coincide with the body axis 24. However, when the LEDs 34 are positioned at the source focal points 20, the elliptical shape of the partial elliptical bodies 14 will ensure proper mixing of the light from all of the LEDs 34 at the common focal point 22. As described below, the various LEDs 34 (or clusters thereof) may emit the same or different colors of light.

When light sources, such as the LEDs 34, are provided in the source inlet 16 at each source focal point 20 of the different elliptical bodies 14, light emitted from each LED 34 is substantially mixed at the common focal point 22 due to the elliptical nature of the partially elliptical bodies 14 and the shared solid interior 26. The different LEDs 34 may emit different colors of light wherein the mixed light available at the common focal point 22 has a desired color, color temperature, or other desired characteristic. For example, one or more LEDs 34 of a first color, such as red (R), may be provided at a first set of the source focal points 20, and LEDs 34 of a different color, such as blue-shifted yellow (BSY), or blue-shifted green (BSG) may be provided at a different set of the source focal points 20. While red, BSY, and BSG colored LEDs 34 are used in the examples, any color or combination of LEDs 34 may be employed. For example, white LEDs of varying color temperatures may be used in a first embodiment; red, green, and blue LEDs may be used in a second embodiment; and the like.

Figure 5:
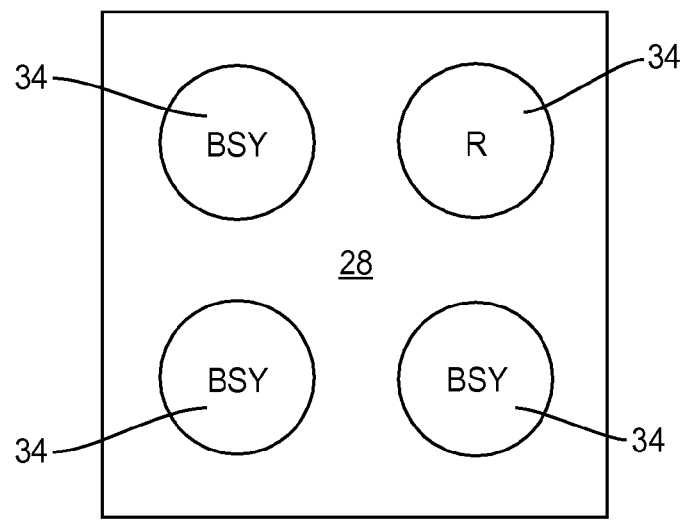
FIG. 5 shows a printed circuit board upon which LEDs are mounted in accordance with an embodiment of the present disclosure.
Figure 6:
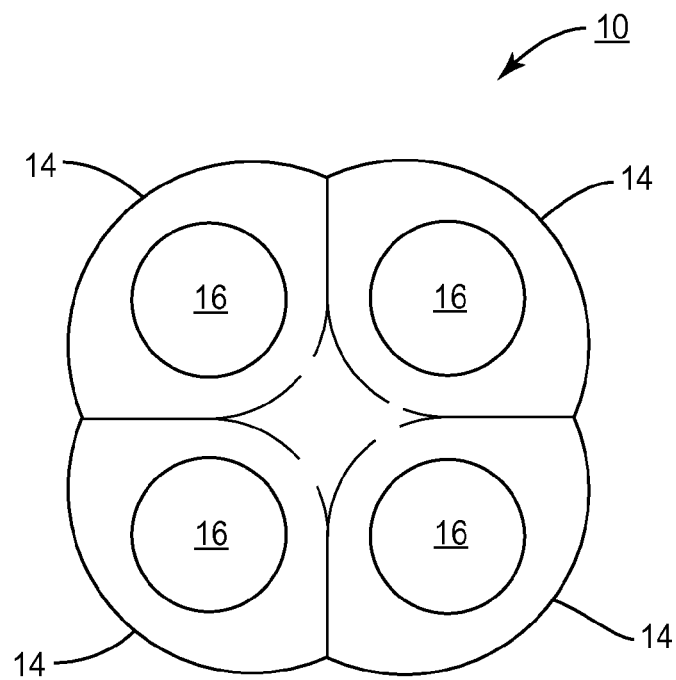
FIG. 6 shows a top view of the optic shown in FIG. 1.

FIG. 5 illustrates the printed circuit board 28 of FIG. 4 with four LEDs 34. One LED 34 is red (R), and the other three are BSY. FIG. 6 illustrates a top view of the optic 10 with four partial elliptical tubes 14, and thus four source inlets 16. When the printed circuit board 28 of FIG. 5 is flipped over and placed on top of the optic 10 of FIG. 6, each of the LEDs 34 will extend into the source inlets 16 and come to rest at the source focal points 20. Assuming the respective LEDs 34 are properly specified and driven, the resulting mix of light at the common focal point 22 may be white light at a desired color temperature and intensity. The white light will flow out of the common outlet 18.

Figure 7:
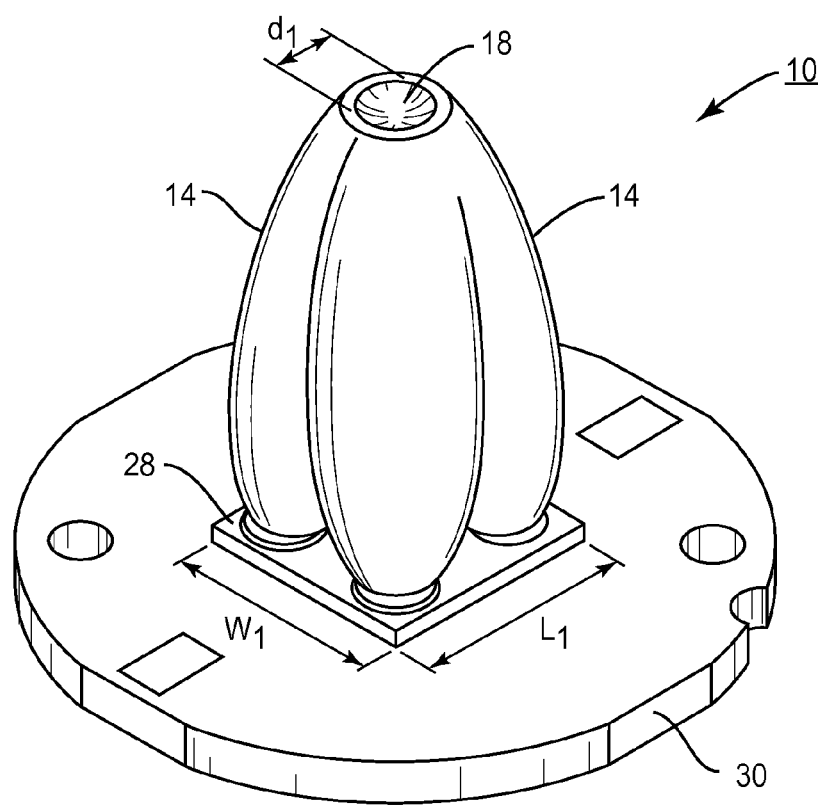
FIG. 7 is a bottom isometric view of the assembly shown in FIG. 5.

FIG. 7 illustrates a bottom isometric view of the optic 10 attached to the printed circuit board 28, which is further attached to the mounting structure 30. The overall size of the optic 10, and thus the sizes of the partial elliptical bodies 14, are scalable while still maintaining the disparate source focal points 20 and the collocated common focal point 22 such that the optic 10 is scalable to fit any application. In an embodiment, the optic 10 may range in height from about 0.25 inches to about 2.0 inches. In a further embodiment, the size of the optic 10 may be in a range from 0.75 inches to about one inch. Moreover, the printed circuit board 28, or any other mounting substrate for the LEDs 34, may have a first area that is defined by an area bound by the LEDs 34. In FIG. 7 the first area is an area defined by the length $L_1$ and the width $W_1$. This first area may be significantly larger than the area of the common outlet 18. The area of the common outlet is defined as $\Pi(d_1/2)^2$. For example, the first area may be two, three, four, five, ten or more times larger than the area of the common outlet 18.

Figure 8A:
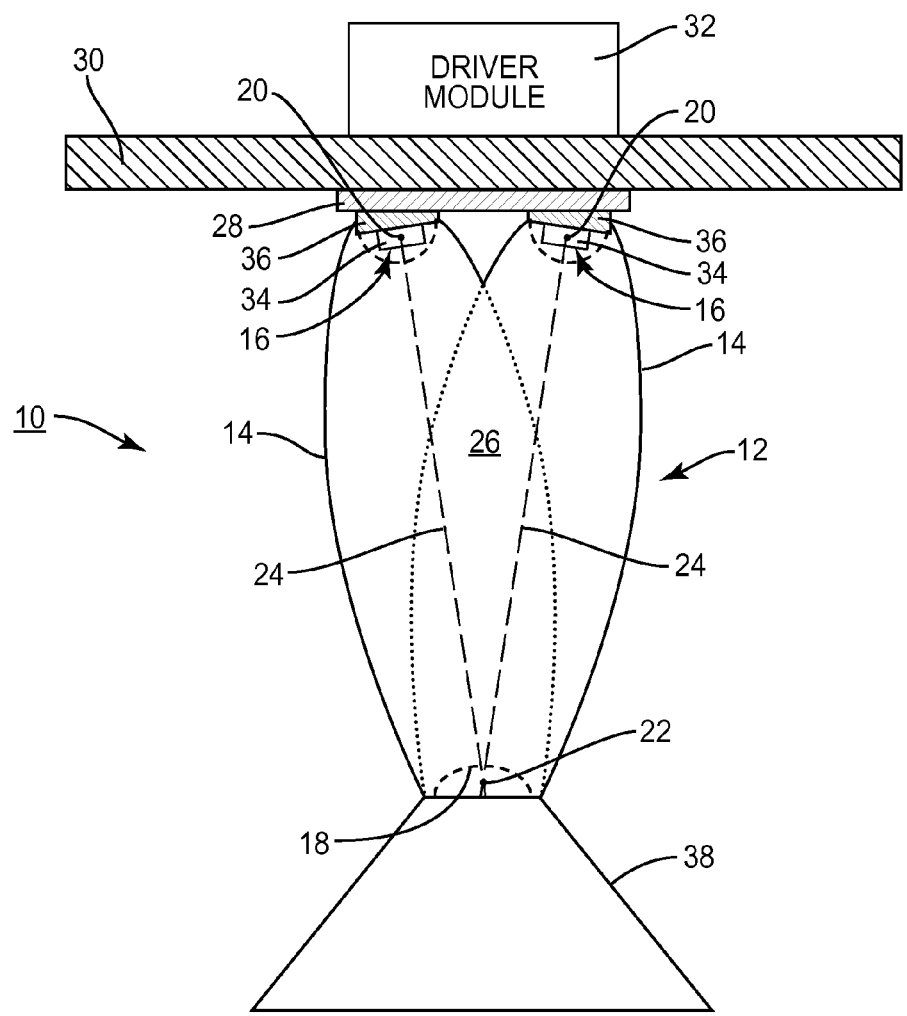
FIG. 8A shows the optic of FIG. 1 with an external reflector cone in accordance with an embodiment of the present disclosure.
Figure 8B:
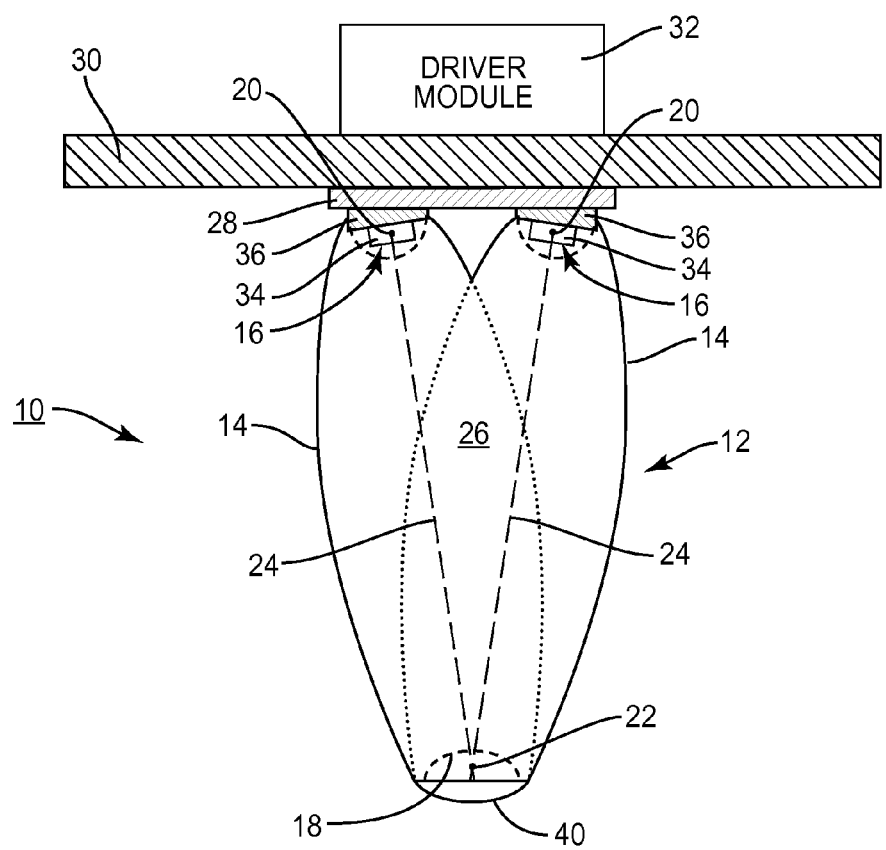
FIG. 8B shows the optic of FIG. 1 with a lens assembly in accordance with an embodiment of the present disclosure.
Figure 8C:
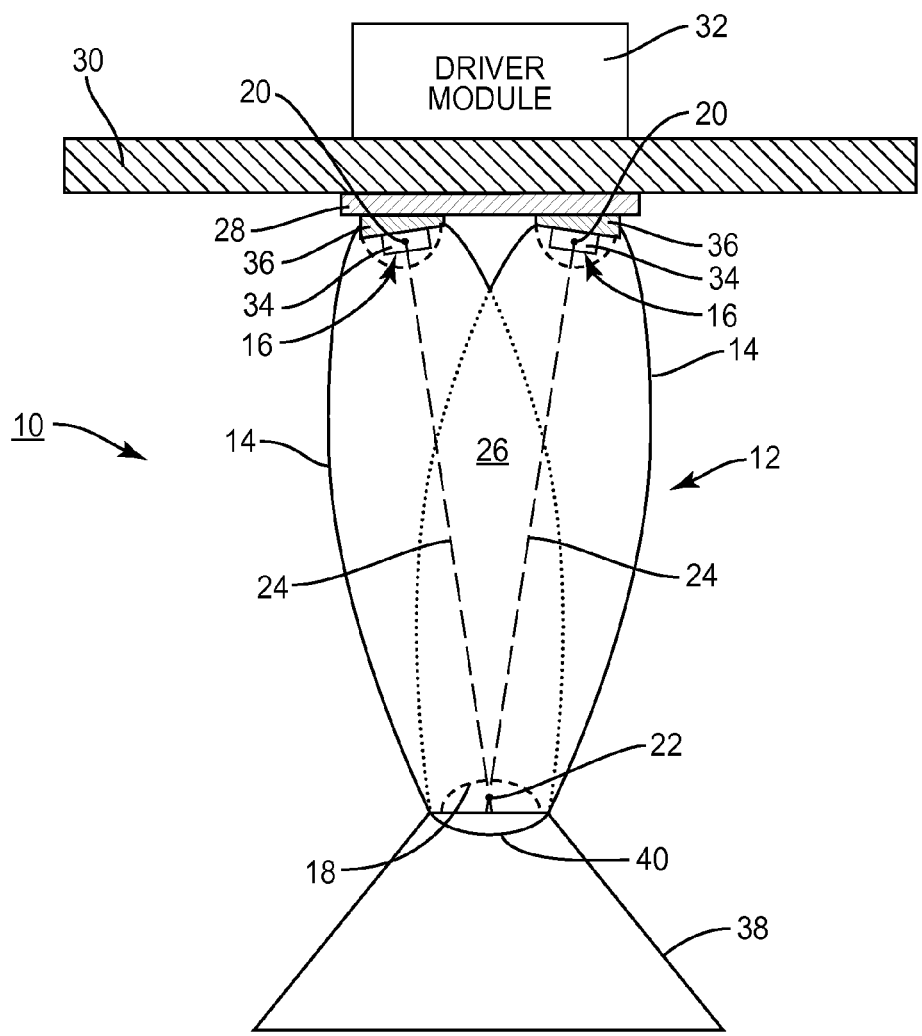
FIG. 8C shows the optic of FIG. 1 having both an external reflector and a lens assembly in accordance with an embodiment of the present disclosure.

Various implements may be attached to the optic 10. FIG. 8A illustrates a conical external reflector 38, which is attached about the common outlet 18. While the conical external reflector 38 is illustrated, virtually any shape or size of reflector may be employed to help further shape the light beam exiting the common outlet 18. FIG. 8B illustrates a hemispherical lens assembly 40, which is attached about the common outlet 18. The lens assembly 40 may be integrally formed with the optic 10 and take on any desired shape. For example, the lens assembly 40 could be flat or planar, as opposed to hemispherical. FIG. 8C illustrates an embodiment where the optic 10 includes both the external reflector 38 and the hemispherical lens assembly 40.

The lens assembly 40 for any of the above embodiments may include a relatively clear lens and a diffuser. The lens may be used to help shape the light output from the common outlet 18, and the diffuser may be used to further mix the light that exits within the optic 10 via the common outlet 18. The degree and type of diffusion provided by the diffuser may vary from one embodiment to another. Further, color, translucency, or opaqueness of the diffuser may vary from one embodiment to another. Diffusers are typically formed from a polymer or glass, but other materials are viable and will be appreciated by those skilled in the art.

Similarly, the lens generally corresponds to the shape and size of the diffuser as well as the front opening of the light source housing. As with the diffuser, the material, color, translucency, or opaqueness of the lens may vary from one embodiment to another. Further, both the diffuser and the lens may be formed from one or more materials or one or more layers of the same or different materials. The optic 10 may be equipped with multiple diffusers or lenses. From an aesthetics perspective, the diffusion provided by the diffuser also prevents the emitted light from looking pixelated, and obstructs the ability for a user to see the individual LEDs 34.

A more traditional approach to diffusion is to provide a diffuser that is separate from the lens. As such, the lens is effectively transparent and does not add any intentional diffusion. The diffuser provides the intentional diffusion. As a first alternative, the diffuser may take the form of a film that is directly applied to one or both surfaces of the lens. Such film is considered a "volumetric" film, wherein light diffusion occurs within the body of the diffusion film. One exemplary diffusion film is the ADF 3030 film provided by Fusion Optix, Inc. of 19 Wheeling Avenue, Woburn Mass. 01801, USA.

As a second alternative, the lens assembly 40 may be configured as a composite lens, which provides the functionality of both the lens and the diffuser. Such a composite lens may be a volumetric lens, which means the light passing through the composite lens is diffused in the body of the composite lens. The composite lens referenced above could be made of a diffusion grade acrylic or a polycarbonate material such as Bayer Makrolon® FR7087, Makrolon® FR7067, with 0.5% to 2% diffusion doping or Sabic EXRL0747-WH8F013X, EXRL0706-WHTE317X, LUX9612-WH8E490X and LUX9612-WH8E508X. The WHxxxxxx defines the degree of diffusion.

With reference to FIGS. 9 and 10, another exemplary optic 10 for a lighting fixture is illustrated in accordance with an embodiment of the present disclosure. This optic 10 includes a body 12 formed by a twelve partial elliptical bodies 14. The optic 10 has twelve source inlets 16 at the top end of the partial elliptical bodies 14, as shown in FIG. 9, and a common outlet 18 at the bottom ends of the partial elliptical bodies 14, as shown in FIG. 10. Again, the bottom ends of the partial elliptical bodies 14 effectively converge with one another, such that there is only one common outlet 18.

FIG. 11 illustrates a printed circuit board 28 with twelve LEDs 34. Four LEDs 34 are red (R), and the other eight LEDs are BSY. FIG. 12 illustrates a top view of the optic 10 with twelve partial elliptical tubes 14, and thus twelve source inlets 16. When the printed circuit board 28 of FIG. 11 is flipped over and placed on top of the optic 10 of FIG. 12, each of the LEDs 34 will extend into the source inlets 16 and come to rest at the source focal points 20. Assuming the respective LEDs 34 are properly specified and driven, the resulting mix of light at the common focal point 22 may be white light at a desired color temperature and intensity. The white light will flow out of the common outlet 18. While white light at a desired color temperature is used in the example, any color of light may be generated at the common focal point 22 with the appropriate configuration and drive of the various LEDs 34.

With reference to FIG. 13, a traditional package for an LED 34 is illustrated. A single LED chip 42 is mounted on a reflective cup 44 using solder or a conductive epoxy, such that ohmic contacts for the cathode (or anode) of the LED chip 42 are electrically coupled to the bottom of the reflective cup 44. The reflective cup 44 is either coupled to or integrally formed with a first lead 46 of the LED 34. One or more bond wires 48 connect ohmic contacts for the anode (or cathode) of the LED chip 42 to a second lead 50.

The reflective cup 44 may be filled with an encapsulant material 52 that encapsulates the LED chip 42. The encapsulant material 52 may be clear or contain a wavelength conversion material, such as a phosphor, which is described in greater detail below. The entire assembly is encapsulated in a clear protective resin 54, which may be molded in the shape of a lens to control the light emitted from the LED chip 42.

An alternative package for an LED 34 is illustrated in FIG. 14, wherein the LED chip 42 is mounted on a substrate 56. In particular, the ohmic contacts for the anode (or cathode) of the LED chip 42 are directly mounted to first contact pads 58 on the surface of the substrate 56. The ohmic contacts for the cathode (or anode) of the LED chip 42 are connected to second contact pads 60, which are also on the surface of the substrate 56, using bond wires 62. The LED chip 42 resides in a cavity of a reflector structure 64, which is formed from a reflective material and functions to reflect light emitted from the LED chip 42 through the opening formed by the reflector structure 64. The cavity formed by the reflector structure 64 may be filled with an encapsulant material 52 that encapsulates the LED chip 42. The encapsulant material 52 may be clear or contain a wavelength conversion material, such as a phosphor.

In either of the embodiments of FIGS. 13 and 14, if the encapsulant material 52 is clear, the light emitted by the LED chip 42 passes through the encapsulant material 52 and the protective resin 54 without any substantial shift in color. As such, the light emitted from the LED chip 42 is effectively the light emitted from the LED 34. If the encapsulant material 52 contains a wavelength conversion material, substantially all or a portion of the light emitted by the LED chip 42 in a first wavelength range may be absorbed by the wavelength conversion material, which will responsively emit light in a second wavelength range. The concentration and type of wavelength conversion material will dictate how much of the light emitted by the LED chip 42 is absorbed by the wavelength conversion material as well as the extent of the wavelength conversion. In embodiments where some of the light emitted by the LED chip 42 passes through the wavelength conversion material without being absorbed, the light passing through the wavelength conversion material will mix with the light emitted by the wavelength conversion material. Thus, when a wavelength conversion material is used, the light emitted from the LED 34 is shifted in color from the actual light emitted from the LED chip 42.

As noted above, the printed circuit board 28 may include a group of BSY or BSG LEDs 34 as well as a group of red LEDs 34. BSY LEDs 34 include an LED chip 42 that emits bluish light, and the wavelength conversion material is a yellow phosphor that absorbs the blue light and emits yellowish light. Even if some of the bluish light passes through the phosphor, the resultant mix of light emitted from the overall BSY LED 34 is yellowish light. The yellowish light emitted from a BSY LED 34 has a color point that typically falls above the Black Body Locus (BBL) on the 1931 CIE chromaticity diagram wherein the BBL corresponds to the various color temperatures of white light.

Similarly, BSG LEDs 34 include an LED chip 42 that emits bluish light; however, the wavelength conversion material is a greenish phosphor that absorbs the blue light and emits greenish light. Even if some of the bluish light passes through the phosphor, the resultant mix of light emitted from the overall BSG LED 34 is greenish light. The greenish light emitted from a BSG LED 34 typically has a color point that also falls above the BBL on the 1931 CIE chromaticity diagram wherein the BBL corresponds to the various color temperatures of white light.

The red LEDs 34 generally emit reddish light at a color point on the opposite side of the BBL (or below) as the yellowish or greenish light of the BSY or BSG LEDs 34. As such, the reddish light from the red LEDs 34 mixes with the yellowish or greenish light emitted from the BSY or BSG LEDs 34 to generate white light that has a desired color temperature and falls within a desired proximity of the BBL. In effect, the reddish light from the red LEDs 34 pulls the yellowish or greenish light from the BSY or BSG LEDs 34 to a desired color point on or near the BBL. Notably, the red LEDs 34 may have LED chips 42 that natively emit reddish light wherein no wavelength conversion material is employed. Alternatively, the LED chips 42 may be associated with a wavelength conversion material, wherein the resultant light emitted from the wavelength conversion material and any light that is emitted from the LED chips 42 without being absorbed by the wavelength conversion material mixes to form the desired reddish light.

The blue LED chip 42 used to form either the BSY or BSG LEDs 34 may be formed from a gallium nitride (GaN), indium gallium nitride (InGaN), silicon carbide (SiC), zinc selenide (ZnSe), or like material system. The red LED chip 42 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08560, and the like. The above LED architectures, phosphors, and material systems are merely exemplary and are not intended to provide an exhaustive listing of architectures, phosphors, and materials systems that are applicable to the concepts disclosed herein.

As noted, the optic 10 may include a mixture of red LEDs 34 and either BSY or BSG LEDs 34. An exemplary driver module 32 for driving the LEDs 34 is illustrated in FIG. 15 according to one embodiment of the disclosure. The LEDs 34 are electrically divided into one or more strings of series connected LEDs. As depicted, there are three LED strings S1, S2, and S3. For clarity, the reference number "34" will include a subscript indicative of the color of the LED 34 in the following text where 'R' corresponds to red, BSY corresponds to blue shifted yellow, BSG corresponds to blue shifted green, and BSX corresponds to either BSG or BSY LEDs. LED string S1 includes a number of red LEDs $34_R$, LED string S2 includes a number of either BSY or BSG LEDs $34_{BSX}$, and LED string S3 includes a number of either BSY or BSG LEDs $34_{BSX}$. The driver module 32 controls the current delivered to the respective LED strings S1, S2, and S3. The current used to drive the LEDs 34 is generally pulse width modulated (PWM), wherein the duty cycle of the pulsed current controls the intensity of the light emitted from the LEDs 34.

The BSY or BSG LEDs $34_{BSX}$ in the second LED string S2 may be selected to have a slightly more bluish hue (less yellowish or greenish hue) than the BSY or BSG LEDs $34_{BSX}$ in the third LED string S3. As such, the current flowing through the second and third strings S2 and S3 may be tuned to control the yellowish or greenish light that is effectively emitted by the BSY or BSG LEDs $34_{BSX}$ of the second and third LED strings S2, S3. By controlling the relative intensities of the yellowish or greenish light emitted from the differently hued BSY or BSG LEDs $34_{BSX}$ of the second and third LED strings S2, S3, the hue of the combined yellowish or greenish light from the second and third LED strings S2, S3 may be controlled in a desired fashion.

The ratio of current provided through the red LEDs $34_R$ of the first LED string S1 relative to the currents provided through the BSY or BSG LEDs $34_{BSX}$ of the second and third LED strings S2 and S3 may be adjusted to effectively control the relative intensities of the reddish light emitted from the red LEDs $34_R$ and the combined yellowish or greenish light emitted from the various BSY or BSG LEDs $34_{BSX}$. As such, the intensity and the color point of the yellowish or greenish light from BSY or BSG LEDs $34_{BSX}$ can be set relative to the intensity of the reddish light emitted from the red LEDs $34_R$. The resultant yellowish or greenish light mixes with the reddish light to generate white light that has a desired color temperature and falls within a desired proximity of the BBL.

The driver module 32 depicted in FIG. 15 may include rectifier and power factor correction (PFC) circuitry 66, conversion circuitry 68, and current control circuitry 70. The rectifier and PFC circuitry 66 is adapted to receive an AC power signal (AC IN), rectify the AC power signal, and correct the power factor of the AC power signal. The resultant signal is provided to the conversion circuitry 68, which converts the rectified AC power signal to a DC signal. The DC signal may be boosted or bucked to one or more desired DC voltages by DC-DC converter circuitry, which is provided by the conversion circuitry 68. A DC voltage is provided to the first end of each of the LED strings S1, S2, and S3. The same or different DC voltage is also provided to the current control circuitry 70.

The current control circuitry 70 is coupled to the second end of each of the LED strings S1, S2, and S3. Based on any number of fixed or dynamic parameters, the current control circuitry 70 may individually control the pulse width modulated current that flows through the respective LED strings S1, S2, and S3 such that the resultant white light emitted from the LED strings S1, S2, and S3 has a desired color temperature and falls within a desired proximity of the BBL. Certain of the many variables that may impact the current provided to each of the LED strings S1, S2, and S3 include: the magnitude of the AC power signal, the resultant white light, ambient temperature of the driver module 32 or the LEDs 34.

In certain instances, a dimming device provides the AC power signal. The rectifier and PFC circuitry 66 may be configured to detect the relative amount of dimming associated with the AC power signal and provide a corresponding dimming signal to the current control circuitry 70. Based on the dimming signal, the current control circuitry 70 will adjust the current provided to each of the LED strings S1, S2, and S3 to effectively reduce the intensity of the resultant white light emitted from the LED strings S1, S2, and S3 while maintaining the desired color temperature.

The intensity or color of the light emitted from the LEDs 34 may be affected by ambient temperature. If associated with a thermistor 72 or other temperature sensing device, the current control circuitry 70 can control the current provided to each of the LED strings S1, S2, and S3 based on ambient temperature in an effort to compensate for adverse temperature effects. The intensity or color of the light emitted from the LEDs 34 may also change over time. If associated with an optical sensor 74, the current control circuitry 70 can measure the color of the resultant white light being generated by the LED strings S1, S2, and S3 and adjust the current provided to each of the LED strings S1, S2, and S3 to ensure that the resultant white light maintains a desired color temperature.

Those skilled in the art will recognize improvements and modifications to the preferred embodiments of the present disclosure. All such improvements and modifications are considered within the scope of the concepts disclosed herein and the claims that follow.

What is claimed is:

1. A lighting component comprising an optic having a body that is solid throughout and formed from a plurality of partial elliptical bodies, each partial elliptical body of the plurality of the partial elliptical bodies is substantially elliptical about a source focal point and a common focal point such that each source focal point for the partial elliptical bodies is disparately located and each common focal point for the plurality of partial elliptical bodies is collocated, wherein the body has a common outlet proximate the common focal point and a plurality of source inlets where each source inlet of the plurality of source inlets is proximate the source focal point for a corresponding one of the plurality of partial elliptical bodies and characterized by a recess extending into the body.

2. The lighting component of claim 1, wherein the recess is a concave recess.

3. The lighting component of claim 2, wherein the common outlet is characterized by a recess extending into the body.

4. The lighting component of claim 1 further comprising a plurality of light sources wherein each light source of the plurality of light sources is provided in a corresponding source inlet at each source focal point of the plurality of elliptical bodies, such that light emitted from each light source is substantially mixed at the common focal point to provide mixed light.

5. The lighting component of claim 4 wherein each light source of the plurality of light sources is a solid-state light source.

6. The lighting component of claim 5 wherein the solid-state light source comprises at least one LED.

7. The lighting component of claim 4 wherein the plurality of light sources comprises at least one light source that emits light of a first color and at least one light source that emits light of a second color that is substantially different from the first color.

8. The lighting component of claim 7 wherein the at least one light source that emits light of the first color comprises at least one LED and at least one light source that emits light of the second color comprises at least one LED.

9. The lighting component of claim 8 wherein the mixed light is white light.

10. The lighting component of claim 4 wherein the mixed light is white light.

11. The lighting component of claim 4 wherein each partial elliptical body has a body axis that that passes through the source focal point and the common focal point for the partial elliptical body and the light source associated with the partial elliptical body emits light such that a central axis associated with the emitted light coincides with the body axis.

12. The lighting component of claim 4, wherein the optic is scalable based on a size of the light sources.

13. The lighting component of claim 1, wherein the common outlet has an opening and the lighting component further comprises a lens assembly coupled to the body and covering the common outlet opening.

14. The lighting component of claim 13 further comprising an external reflector coupled to an outside surface of the body and surrounding the common outlet.

15. A lighting component comprising:
a mounting substrate comprising a plurality of solid-state light sources; and
an optic having a body that is formed from a plurality of partial elliptical bodies, each partial elliptical body of the plurality of the partial elliptical bodies is substantially elliptical about a source focal point and a common focal point such that each source focal point for the partial elliptical bodies is disparately located and each common focal point for the plurality of partial elliptical bodies is collocated, wherein:

the body has a common outlet proximate the common focal point and a plurality of source inlets;

each source inlet is proximate the source focal point for a corresponding one of the plurality of partial elliptical bodies; and each light source of the plurality of light sources is disposed in a corresponding source inlet at each focal point of the plurality of elliptical bodies, such that light emitted from each light source is substantially mixed at the common focal point to provide mixed light.

16. The lighting component of claim 15, wherein the body is solid throughout.

17. The lighting component of claim 16, wherein each of the plurality of source inlets are characterized by a recess extending into the body.

18. The lighting component of claim 17, wherein the recess is a concave recess.

19. The lighting component of claim 17, wherein the common outlet is characterized by a recess extending into the body.

20. The lighting component of claim 15 wherein each light source of the plurality of light sources is a solid-state light source.

21. The lighting component of claim 20 wherein the solid-state light source comprises at least one LED.

22. The lighting component of claim 15 wherein the plurality of light sources comprises at least one light source that emits light of a first color and at least one light source that emits light of a second color that is a substantially different from the first color.

23. The lighting component of claim 22 wherein the at least one light source that emits light of the first color comprises at least one LED and at least one light source that emits light of the second color comprises at least one LED.

24. The lighting component of claim 23 wherein the mixed light is white light.

25. The lighting component of claim 15 wherein the mixed light is white light.

26. The lighting component of claim 15 wherein each partial elliptical body has a body axis that that passes through the source focal point and the common focal point for the partial elliptical body and the light source associated with the partial elliptical body emits light such that a central axis associated with the emitted light coincides with the body axis.

27. The lighting component of claim 1, further comprising:

a mounting substrate comprising a plurality of solid-state light sources, such that a first area is defined by an area bound by the plurality of solid-state light sources, wherein the common outlet is substantially opposite the plurality of source inlets and each light source of the plurality of solid-state light sources is disposed in a corresponding source inlet of the plurality of source inlets and the first area is at least two times an area of the common outlet.

28. The lighting component of claim 27 wherein the first area is at least three times the area of the common outlet.

29. The lighting component of claim 27 wherein the first area is at least four times the area of the common outlet.

* * * * *